United States Patent [19]
Kornblit et al.

[11] Patent Number: 5,948,570
[45] Date of Patent: *Sep. 7, 1999

[54] PROCESS FOR DRY LITHOGRAPHIC ETCHING

[75] Inventors: Avinoam Kornblit, Highland Park; Anthony Edward Novembre, Union, both of N.J.

[73] Assignee: Lucent Technologies Inc., Murray Hill, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 08/451,283

[22] Filed: May 26, 1995

[51] Int. Cl.$^6$ ........................................ G03F 9/00
[52] U.S. Cl. ................ 430/5; 430/302; 430/318
[58] Field of Search .............. 430/5, 318, 302; 252/79.1

[56] References Cited

U.S. PATENT DOCUMENTS 4,370,196  1/1983  Vossen, Jr. et al. .................... 156/643

FOREIGN PATENT DOCUMENTS

| 0518 545 A1 | 12/1992 | European Pat. Off. .......... G03F 7/40 |
| 0518545 | 12/1992 | European Pat. Off. . |
| 6230557 | of 0000 | Japan ................ G03F 1/08 |
| 3033848 | 6/1989 | Japan ................ G03F 1/08 |

OTHER PUBLICATIONS

"Patterning of X–Ray Masks Using the Negative–Acting Resist P(Si–CMS)" by Mixon, D. A. et al., *J. Vac. Sci. Technol.*, B11(6), pp. 2834–2838 (Nov./Dec. 1993).

Jurgensen, C. W., et al., "Tungsten Patterning for 1:1 X–Ray Masks", J. Vac. Sci. Techoll B 9 (6), (Nov./Dec. 1991), pp. 3280–3286.

Allen, L. R., "Tapered Aluminum Interconnect Etch", J. Vac. Sci. Technol., A 12 (4), (Jul./Aug. 1994), pp. 1265–1268.

Novembre, A. E., et al., "Dry Etch Patterning of Chrome on Glass Optical Masks Using P(SI–CMS)Resist", SPIE, vol. 2087, Photomask Technology and Management (1993).

Tedesco, S., et al., "Dry Etching for High Resolution Maskmaking", SPIE, vol. 1264, Optical/Laser Microlithography III (1990), pp. 144–157.

*Primary Examiner*—Thorl Chea
*Attorney, Agent, or Firm*—Richard J. Botos

[57] ABSTRACT

Patterning of a layer of material that can be etched with gaseous mixture of oxygen, chlorine, and nitrogen as etchant species, such as a chromium or a chromium-containing compound layer, is accomplished by using a patterned organometallic resist, such as a polymer which contains silicon or germanium. Although gaseous mixtures of chlorine and oxygen etch chromium anisotropically. Some undercut of the chromium is still observed. This undercut is controlled or eliminated by adding nitrogen to the gas mixture. Layers of material that have been patterned in this way can then be used for photolithographic masks or reticles, for X-ray masks, for e-beam masks. or for direct patterning of other, underlying layers in semiconductor integrated circuits or other devices.

14 Claims, 2 Drawing Sheets

PROCESS FOR DRY LITHOGRAPHIC ETCHING

TECHNICAL FIELD

This invention relates to dry lithographic etching and more particularly to methods for dry lithographic etching of metals or metal compounds or other materials that can be anisotropically etched using gaseous mixtures that contain oxygen and chlorine as the etchant species.

BACKGROUND OF THE INVENTION

Lithographic etching of layers of material for subsequent use as either photolithographic, X-ray or e-beam masks, is important, for example, in conjunction with fabricating semiconductor integrated circuits or other devices. Such masks are used for pattern transfer from the mask to the device. Commercially promising layers of material for X-ray and e-beam masks include layers composed of chrome (chromium), chromium-containing compounds, and tungsten. Chrome-containing photolithographic masks are typically a layer of chrome formed on glass or quartz.

In U.S. Pat. No. 4,876,164 issued on Oct. 24, 1989, to Watakabe et al, a method is described for patterning a chrome layer so that it could be used as a mask. In that method a chrome layer is deposited on a transparent glass substrate. An organic resist layer is then formed on the chrome layer, and the resist layer is patterned, as by optical or electron beam scanning (direct writing) followed by wet developing. Then the thus exposed portions of the chrome layer are etched away by means of a gas plasma process using a gaseous mixture that contains oxygen and chlorine. Finally the patterned resist layer is removed.

A problem with the foregoing process, as was found by Watakabe et al, is a low selectivity of the plasma etching of the chrome relative to the etching of the resist. Etch selectivity is the etch rate of one material compared to that of another material under the same etching conditions. Watakabe et al. reports that the ratio of the etch rate of the chrome to that of the resist is undesirably low, typically (as we have found) only about 1.5/1.0 or less when reactive ion etching (RIE) is used. The low selectivity between the resist and the chrome requires the thickness of the resist layer to be undesirably high. When thick resist layers are used during the etching of the chrome, the lateral width of the resist layer is undesirably reduced, whereby the the pattern etched into the chrome layer is degraded.

Jurgensen, C. W., et al., "Tungsten Patterning for 1:1 X-Ray Masks," *J. Vac. Sci. Technol.*, B 9(6), pp. 3320–3286 (1991) describes a process for etching a pattern into a layer of chromium. The chromium layer is formed on a layer of tungsten overlying another layer of chromium which was formed on a polysilicon or silicon nitride membrane. The pattern is formed in the chromium layer by forming an e-beam resist layer onto the top chromium layer, subjecting the resist to a patternwise exposure, and developing the pattern. One of the e-beam resists described in Jurgensen et al. is poly(trimethylsilylmethyl methacrylate-co-3,4-chloromethylstyrene). The pattern is then transferred into the underlying chromium layer using an oxygen/chlorine plasma. The pattern is then transferred into the underlying tungsten layer using a fluorine-based plasma.

Tedesco, S., et al. "Dry Etching For High Resolution Mask Masking" *SPIE, Laser Microlithography* 111, Vol. 1264, pp. 144, 57 (1990), report that it is difficult to consistently obtain an anisotropic etch profile in chrome using the oxygen-chlorine etch mixture. An anisotropic etch profile is desired for accurate pattern transfer. The more anisotropic the etch profile, i.e., the less lateral etch that occurs, the more accurate the pattern transfer.

Therefore, it would be desirable to have a method for fabricating masks composed of chrome (or of other material that can be anisotropically etched in a gaseous mixture that contains oxygen and chlorine as the etchant species) that does not suffer from the shortcomings of prior art.

SUMMARY OF THE INVENTION

A patterned masking layer or other patterned layers of material, composed of a material that can be anisotropically reactive ion etched in a gaseous mixture that contains oxygen, chlorine, and nitrogen as etchant species—such as a material composed of chrome or of a chrome-containing compound—is formed by anisotropic reactive ion etching ("RIE") a uniform layer of such material in a gaseous mixture of oxygen, chlorine, and nitrogren. This anisotropic RIE is performed while using a patterned resist layer composed of an organometallic material—i.e., an organic material that is imbued with a metallic component—for protection of the layer of mask material against the RIE. It is advantageous if the metallic component is a refractory metal e.g. silicon, zirconium, and titanium. One example of a suitable organometallic resist is poly(trimethylsilylmethylmethacrylate-co-chloromethylstyrene) (P(SI-CMS)). P(SI-CMS) is described in Novembre, A., et al., "Dry Etch Patterning of Chrome on Glass Optical Masks using P(SI-CMS) resist," *SPIE, Photomask Technology and Management*, Vol. 2087, pp. 50–56 (1993), which is hereby incorporated by reference.

Typically, the organometallic resist layer has been patterned by having been subjected to a patterned (intensity-modulated scanning) beam of actinic radiation (photon, ion, or electron beam) followed by a development of this resist layer. In this way a patterned organometallic resist layer is formed in accordance with the pattern of the patterned beam, and consequently, portions of the underlying layer of material become exposed. The thus exposed portions of the layer of material are then dry etched with a gaseous mixture of oxygen, chlorine, and nitrogen—whereby the pattern of the beam of actinic radiation is transferred to the layer of material, so that it becomes a patterned layer of material.

In the process of the present invention, the pattern is transferred from the resist into the underlying chromium layer using a plasma gas mixture containing three components: oxygen, chlorine and nitrogen. The oxygen and chlorine are combined in a volume ratio relative to each other, of about 1:4 to about 4:1. The ratios are expressed as oxygen to chlorine. The nitrogen is combined with the oxygen/chlorine mixture such that the resulting three component gas mixture is about 0.1 volume percent to about 70 volume percent nitrogen. In a preferred embodiment, the oxygen, chlorine and nitrogen are present in the plasma in equal parts by volume.

The amount of nitrogen in the gas mixture is related to the extent to which the chromium is laterally etched during the etching process. As used herein the term "anisotropic reactive ion etching" is meant to include simultaneous gaseous (dry) chemical and energetic ion etching, i.e., a simultaneous chemical and physical etching process involving a glow discharge. Thus, in addition to reactive ion etching (RIE), for example, chemically assisted ion beam etching is also included.

In order to enhance further the etching selectivity that can be obtained during the etching of the layer of material, the patterned organometallic resist layer is subjected—prior to the RIE of the layer of material with the gaseous mixture of oxygen, chlorine and nitrogren—to an auxiliary ion bombardment step with an etchant gas that contains oxygen but not chlorine. With or without this auxiliary (chlorine absent) ion bombardment with oxygen, greater durability (resistance) of the organometallic resist during the etching of the layer of material—and hence improved etching selectivity—is achieved than in cases where the organic resist is not uniformly metal-containing.

In any event, after the layer of material has been patterned, the remaining (patterned) organometallic resist layer can be removed by a known procedure, so that the thus remaining patterned layer of material can be used as a mask or reticle in either an optical, an X-ray, or an e-beam lithography system. Typically, the layer of material formed on some sort of supporting substrate, as well as perhaps other underlying layer or layers, depending upon the desired ultimate use of the patterned layer of material—e.g., optical lithographic mask, X-ray mask, or e-beam mask. Also, this patterned layer of material can be used to define features in such underlying layers or in the substrate.

BRIEF DESCRIPTION OF THE DRAWING(S)

This invention together with its features, characteristics, and advantages may be better understood from the following detailed description when read in conjunction with the drawings in which:

FIG. 1–3 are elevational views in cross section of various stages in the manufacture of a photolithographic mask 300, in accordance with a specific embodiment of the invention; and FIG. 4–5 are elevational view in cross section of various stages in the manufacture of an X-ray lithographic mask 500, in accordance with another specific embodiment of the invention.

DETAILED DESCRIPTION

Figure 1:
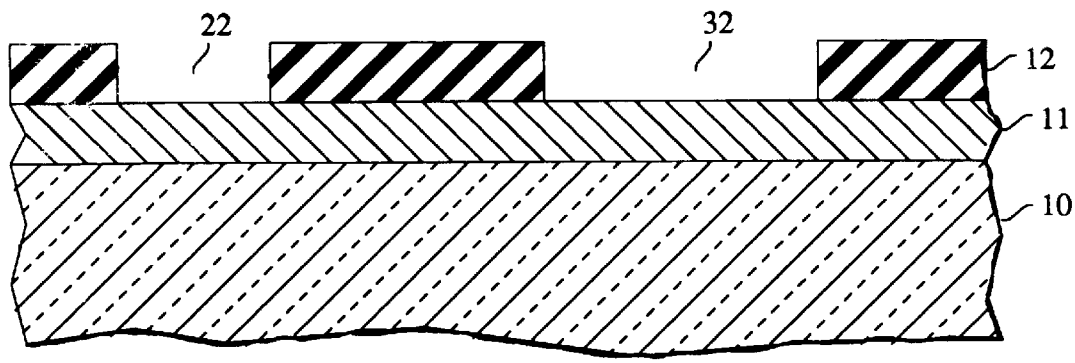

Referring now to FIG. 1, upon a major top surface of a transparent substrate 10, typically silica glass, there is located a layer of material 11 such as a metallic layer 11, typically of uniformly thick chrome. At any rate, this layer of material 11 has the property that it can be etched in a gaseous mixture of oxygen and chlorine as etchant species. This metallic layer 11 is typically deposited by means of evaporation or by sputtering from a metal target; and it has a uniform thickness of typically about 100 nm (1,000 Å). Upon the top surface of this metallic layer 11 is located a polymer resist layer 12 which contains a refractory metal such as silicon so that it is an organometallic resist layer, and more specifically is an organosilicon resist layer. It is advantageous if the polymer is about 5 weight percent to about 30 weight percent refractory metal, although one skilled in the art will recognize that the refractory metal content of these materials may be even higher. The organometallic resist layer 12 is typically a silicon-containing polymer such as poly(trimethylsilylmethyl methacrylate-co-chloromethylstyrene), but other suitable silicon-containing polymer resists can be used. It is also contemplated that the silicon may be introduced into the resist by a mechanism such as silylation. Advantageously, the silicon is uniformly distributed in three dimensions throughout the organometallic resist layer 12.

This resist layer 12 (everywhere), prior to etching, has a uniform thickness, typically in the range of about 0.2 to 1 μm. To pattern the resist layer 12, it is subjected to an electron beam, typically of the scanning (direct-writing) type, in accordance with the pattern ultimately desired in the metallic layer 11 (in case the resist layer 12 is composed of a positive tone resist) or in accordance with the complement of the pattern ultimately desired in the metallic layer 11 (in case the resist layer 12 is a negative tone resist). After a (typically wet) development, the resist layer 12 still has a uniform thickness except for spaces 22, 32 penetrating down to the top surface of the metallic layer 11.

Figure 2:
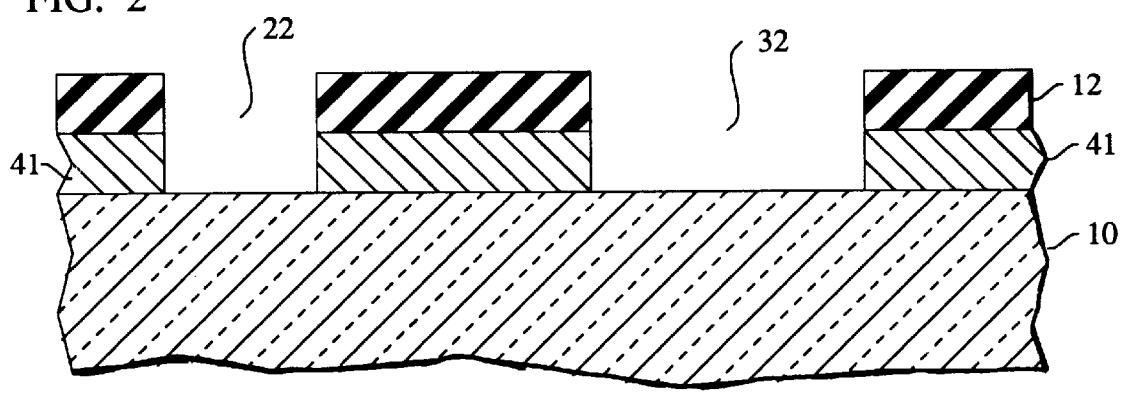

The metallic layer 11 is then etched at its exposed portions to form a patterned metallic layer 41 (FIG. 2). More specifically, for example, the top surface of the device being manufactured is subjected to an anisotropic RIE step, using an etchant gas mixture containing oxygen, chlorine, and nitrogen. The oxygen and chlorine are combined in a volume ratio in the approximate range of between 0.25/1.0 and 4.0/1.0, preferably approximately 1.0/1.0. The oxygen and chlorine mixture is combined with nitrogen so that the etchant gas mixture is about 0.1 volume percent to about 70 volume percent nitrogen and about 99.9 volume percent to about 30 volume percent of the chlorine mixture previously described. In one embodiment, the etchant gas is equal parts by volume chlorine, oxygen, and nitrogen.

The amount of undercut that occurs during the etch is controlled to some degree by the amount of nitrogen in the etchant. Even a small amount of nitrogen, e.g. 0.1 volume percent, will reduce the amount of undercut during the etch somewhat. The more nitrogen that is added, the more the amount of undercut is reduced. For example, ten volume percent nitrogen provides more undercut protection than 0.1 volume percent. When 70 volume percent of the etchant gas is nitrogen, virtually no undercut is observed.

During the etch, the oxygen, chlorine and nitrogen ions are accelerated to a kinetic energy of typically about 100 eV at a gas pressure of typically about 75 mTorr. In this way, the spaces 22, 32 penetrate through the chrome layer 11, where a patterned chrome layer 41 (FIG. 2) is formed. Other gases, such as noble gases, may be added to the etchant gas mixture for the purpose of increasing the ion flux or stabilizing the plasma, or for both purposes.

Advantageously, prior to the above-described RIE step with the gas mixture containing oxygen, chlorine and nitrogen, the patterned organometallic resist is subjected to an ion bombardment step with oxygen (absent chlorine and nitrogen), whereby the etch ratio of chrome/resist during the RIE step with the oxygen/chlorine/nitrogen mixture is improved. During this bombardment, the oxygen ions are accelerated to a kinetic energy of typically about 300 eV at a gas pressure of typically about 5 mTorr.

Figure 3:
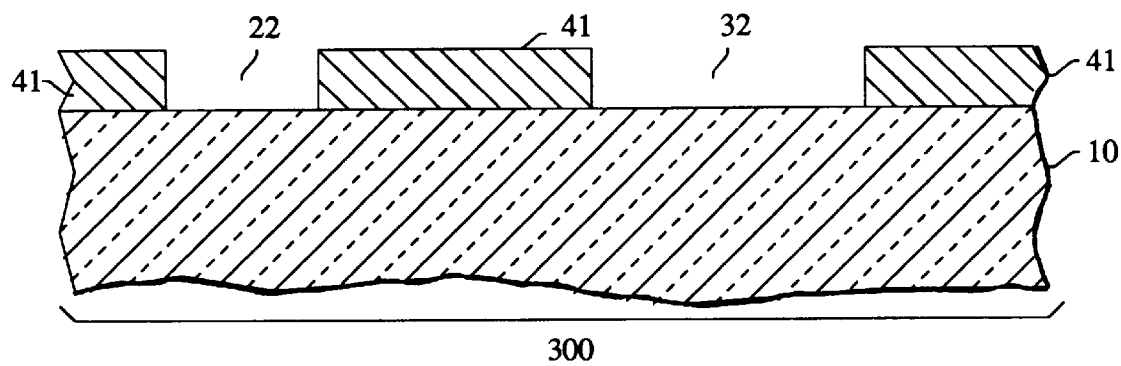

In any event, after the etching of the chrome layer 11 (FIG. 1) to form the patterned chrome layer 41 (FIG. 2), the patterned resist layer 12 is removed, either by dry etching or wet chemical etching, as known in the art. In this way the desired photolithographic mask 300 (FIG. 3) is formed.

Figure 4:
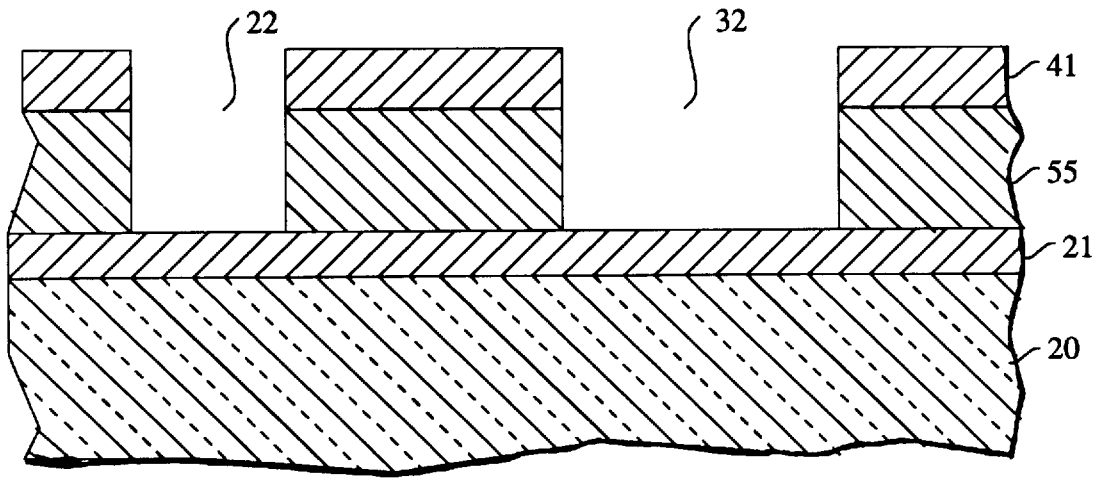
Figure 5:
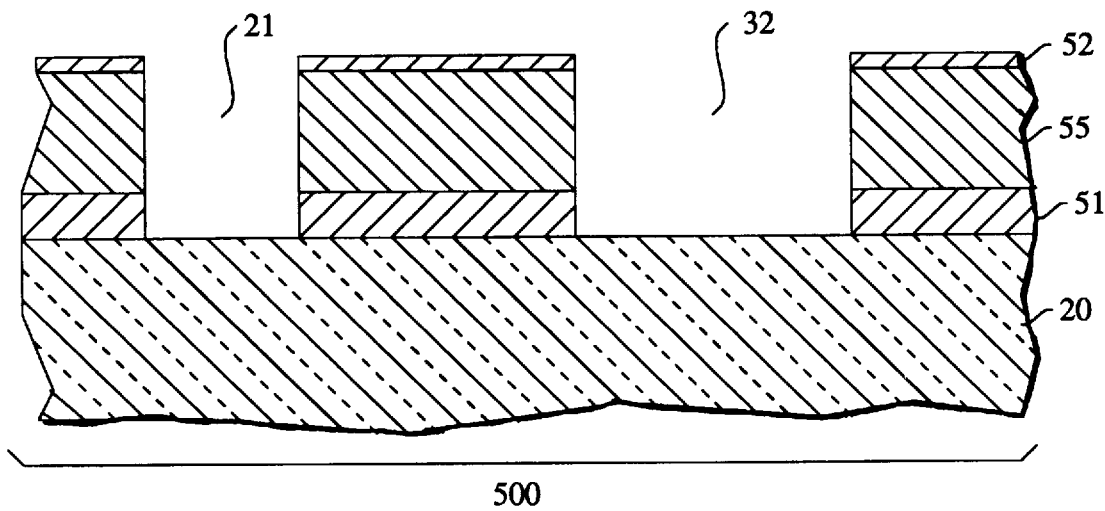

Turning to FIG. 5, in accordance with another specific embodiment of the invention, an X-ray lithographic mask 500 is composed of a supporting membrane 20, in optional patterned chrome layer 51, a patterned tungsten layer 55, and a patterned chrome layer 52. FIG. 4 shows an earlier stage in its manufacture. The chrome layer 41 has been patterned in the same manner as described above, except that it now is located upon the top surface of a uniformly thick tungsten layer 55 which, in turn, has been patterned by means of RIE using a gas mixture of sulphur hexafluoride and carbon monobromotrifluoride, as known in the art, the patterned chrome layer 41 being used as a protective mask.

The (optional) chromium layer 21 located beneath the tungsten layer 55 serves as an etch stop, for terminating the etching of tungsten, as well as a glue for promoting adherence of the tungsten layer 55 to the membrane 20. Then the chrome layer 51 is etched by means of RIE again with a gas mixture chlorine, oxygen, and nitrogen but without an auxiliary bombardment with oxygen. In this way, the chrome layer 21 is patterned to form the patterned chrome layer 51, and at the same time the thickness of the patterned chrome layer 41 is reduced, to form a patterned chrome layer 52 of reduced thickness or even zero thickness depending upon the ratio of the thicknesses of the chrome layers 21 and 41. Thus the desired X-ray mask 500 is formed. The above description was directed to the production of a mask for use in X-ray lithography. However, a like processing sequence is useful for fabricating masks for use in projection e-beam lithography.

In an illustrative example, the thickness of the chrome layer 41 is about 30 nm; of the tungsten layer 55, about 300 nm; and of the chrome layer 21, about 20 nm. The membrane is typically essentially silicon, silicon nitride, silicon carbide, or boron nitride, as known in the art.

Instead of chrome, a chromium-containing material—such as chromium compound containing oxygen or nitrogen or both (e.g., chromium oxynitride), which also can be etched with a gaseous mixture of oxygen and chlorine by a glow discharge pattern-transfer process—can be used for any of the metallic layers 11 and 21.

EXAMPLE 1

A copolymer (about 10 to about 13 grams) of 90 mole percent trimethylsilylmethyl methacrylate and 10 mole percent m,p-chloromethylstyrene was dissolved in ethyl 3-ethoxy propionate (100 ml). The copolymer had a molecular weight 30 to $50 \times 10^3$ g/mol. The solution was filtered three times through a stack of Millipore Teflon filters having pore sizes of about 0.2 to about 1 micron. Three 5"×5" 1000 Å-thick chromium-on-glass blanks obtained from Hoya Electronics were spin coated with 0.2 to 0.5 micron-thick films of the above solution at speeds ranging from 2000 to 5000 rpm.

The chrome-coated glass blanks were then baked at a temperature in the range of about 80° C. to about 100° C. for 30 minutes in a forced air convection oven. The resist-coated chrome-coated glass blanks were patternwise exposed using a Cambridge EBMF Model 10.5 electron beam exposure tool. The tool was operated with an accelerating potential of 40 KeV, a beam spot current of one nA, a beam address of 0.02 $\mu$m. The proximity effect due to backscattered electrons was corrected for some of the exposures. The exposed chrome-coated glass blanks were then developed by spraying an ethanol developer solution thereon for 60 to 110 seconds while the blanks were spinning and rinsed in methanol for 30 seconds and a mixture of 2-propanol and water (7:3) for 45 seconds. The blanks were then baked in a forced air convection oven at 90° C. to 120° C. for 30 minutes.

The resist was then oxidized in an oxygen plasma (40 sccm; 10 mTorr Pressure; and 100 W) for 1 minute. As a result of this oxidation, about 130 Å of the resist was removed. A Plasma Therm SL 720 Etcher was used to etch the resist patterns into the underlying chrome layer at a power setting of 225 W and a pressure of 75 mTorr. The chrome etch rate under these conditions was about 100 Å per minute. Two etch chemistries were employed. One etch chemistry was a 1:1 mixture of oxygen and chlorine (30 sccm oxygen and 30 sccm chlorine). The other etch chemistry was a 1:1:1 mixture of oxygen, chlorine, and nitrogen (30 sccm oxygen; 30 sccm chlorine; and 30 sccm nitrogen). The undercut of the chrome beneath the mask was about 0.1 microns per vertical sidewall using the oxygen/chlorine etch chemistry. The undercut of the chrome beneath the mask was less than or equal to 0.02 microns per vertical sidewall using the oxygen/chlorine/nitrogen etch chemistry.

EXAMPLE 2

A film of the copolymer described in Example 1 was formed on two 3" silicon wafers. Each film was patternwise exposed and developed as described in Example 1. Each film was oxidized in an oxygen plasma (40 sccm; 10 mTorr; and 100 W) for 1 minute. As a result of this oxidation, 130 Å of resist was removed. One film was etched using the oxygen/chlorine etch chemistry described in Example 1 and one film was etched using the oxygen/chlorine/nitrogen etch chemistry described in that Example. The selectivity of each etch chemistry was compared. The selectivity of the oxygen/chlorine etch chemistry was observed to be 6.5 to 1 (i.e. the chrome etched 6.5 times faster than the resist) and the selectivity of the oxygen/chlorine/nitrogen etch chemistry was 9:1. (The chrome etched 9 times faster than the resist.) Therefore, in addition to less undercut of the chromium, the oxygen/chlorine/nitrogen etch selectivity between the resist and the chrome was greater than the prior art oxygen/chlorine etch chemistry.

This invention has been successfully tested—i.e., etching selectivity showed improvement—with resist material that contains silicon or germanium. The (uniform) concentration of germanium in the aforementioned resist advantageously is the approximate range of 10 to 33 wt percent, typically about 28 to 30 wt percent.

Although the invention has been described in terms of specific embodiments, various modifications can be made without departing from the scope of the invention. For example, the RIE of the metallic layer 51 can be omitted in case optical alignment of the mask is not required. Instead of adding silicon or germanium to the organic resist, other metals that form refractory oxides can be added to form an organometallic resist. Finally, the tungsten layer 55 (FIG. 5) can be a patterned metallization or other layer in an integrated circuit or other device, with the membrane 20 replaced by an insulating layer or other component of the integrated circuit or other device that is being fabricated.

The invention claimed is:

1. A method of lithographic etching a layer of material that can be etched by a gaseous mixture that contains oxygen, chlorine, and nitrogen comprising the steps of:
    (a) forming a layer of material that is essentially chrome or a compound that contains chrome on a surface of a substrate;
    (b) forming an organometallic resist layer having an essentially uniform composition on a surface of the layer of material;
    (c) patterning the organometallic resist layer, whereby a patterned organometallic resist layer is formed, and whereby portions of the surface of the layer of material become exposed portions thereof; and
    (d) subjecting the exposed portions of the surface of the layer of material to an anisotropic etching procedure with a gas mixture comprising oxygen, chlorine, and nitrogen, wherein the gas mixture contains more than 10 volume percent to about 70 volume percent nitrogen whereby the exposed portions of the layer of material are etched.

2. The method of claim 1 in which the resist layer contains silicon in a concentration that is sufficient to increase the ratio of the etch rate of the layer of material to that of the resist layer during the anisotropic etching procedure.

3. The method of claim 2 in which the patterned organometallic resist layer is bombarded with oxygen ions prior to being etched in the oxygen, chlorine, and nitrogen etch mixture.

4. The method of claim 2 in which the patterned organometallic resist layer is bombarded with oxygen ions prior to being etched in the oxygen, chlorine and nitrogen etch mixture.

5. The method of claim 1 in which the patterned organometallic resist layer is bombarded with oxygen ions prior to being etched in the oxygen, chlorine and nitrogen etch mixture.

6. The method of claim 5 in which the layer of material is essentially chrome or a compound that contains chromium.

7. The method of claim 6 in which the patterned organometallic resist layer is bombarded with oxygen ions prior to being etched in the oxygen, chlorine an nitrogen etch mixture.

8. A method of manufacturing a mask for use in X-ray lithography comprising the steps of:
   (a) forming a first layer of material that is essentially chrome or a compound that contains chrome on a surface of a second layer of material, the second layer being opaque to exposing radiation to be used in the lithographic process, and the second layer being located upon a supporting membrane which is transparent to the X-ray radiation to be used;
   (b) forming an organometallic resist layer of essentially uniform thickness and composition on a surface of the first layer;
   (c) patterning the organometallic resist layer, whereby predetermined portions of the surface of the first layer become exposed portions thereof;
   (d) subjecting the exposed portions of the surface of the first layer to an anisotropic reactive ion etching procedure with a gaseous mixture that contains oxygen, chlorine, and nitrogen, wherein the gaseous mixture is more than ten volume percent to about 70 volume percent nitrogen, whereby the exposed portions of the first layer are etched and underlying portions of the surface of the second layer become exposed portions thereof; and
   (e) subjecting the exposed portions of the second layer to anisotropic etching, whereby the pattern of the patterned organometallic resist layer is transferred to the second layer, so that the second layer becomes a patterned second layer which can be used as a lithographic mask.

9. The method of claim 8 in which the resist layer contains silicon in a concentration that is sufficient during the anisotropic etching procedure.

10. The method of claim 9 in which the patterned organometallic resist layer is bombarded with oxygen ions prior to being etched in the oxygen, chlorine and nitrogen etch mixture.

11. A method of manufacturing a mask for use in e-beam lithography comprising the steps of:
   (a) forming a first layer of material that is essentially chrome or a compound that contains chrome on a surface of a second layer of material, the second layer being located upon a supporting membrane wherein the second layer scatters electrons significantly more than the supporting membrane;
   (b) forming an organometallic resist layer of essentially uniform thickness and composition on a surface of the first layer;
   (c) patterning the organometallic resist layer, whereby a patterned organometallic resist layer if formed, and whereby portions of the surface of the layer of material become exposed portions thereof; and
   (d) subjecting the exposed portions of the surface of the first layer to an anisotropic reactive ion etching procedure with a gaseous mixture that contains oxygen, chlorine, and nitrogen, wherein the gaseous mixture is more than ten volume percent to about 70 volume percent nitrogen, whereby the exposed portions of the first layer are etched and underlying portions of the surface of the second layer become exposed portions thereof; and
   (e) subjecting the exposed portions of the second layer to anisotropic etching, whereby the pattern of the patterned organometallic resist layer is transferred to the second layer, so that the second layer becomes a patterned second layer which can be used as an e-beam mask.

12. The method of claim 11 in which the resist layer contains silicon in a concentration that is sufficient during the anisotropic etching procedure.

13. The method of claim 12 in which the patterned organometallic resist layer is bombarded with oxygen ions prior to being etched in the oxygen, chlorine and nitrogen etch mixture.

14. A method of manufacturing a stencil mask for use in e-beam lithography comprising the steps of:
   (a) forming a first layer of material that is essentially chrome or a compound that contains chrome on a surface of a second layer of material, wherein the second layer of material absorbs electrons;
   (b) forming a silicon-containing resist layer of essentially uniform thickness and composition on a surface of the first layer;
   (c) patterning the silicon-containing resist layer, whereby a patterned silicon-containing resist layer if formed, and whereby portions of the surface of the layer of material become exposed portions thereof; and
   (d) subjecting the exposed portions of the surface of the first layer to an anisotropic reactive ion etching procedure with a gaseous mixture that contains oxygen, chlorine, and nitrogen, wherein the gaseous mixture is more than ten volume percent to about 70 volume percent nitrogen, whereby the exposed portions of the first layer are etched and underlying portions of the surface of the second layer become exposed portions thereof; and
   (e) subjecting the exposed portions of the second layer to anisotropic etching, whereby the pattern of the patterned silicon-containing resist layer is transferred to the second layer, so that the second layer becomes a patterned second layer which can be used as an e-beam stencil mask.

* * * * *